United States Patent
Pearson et al.

(10) Patent No.: US 6,791,035 B2
(45) Date of Patent: Sep. 14, 2004

(54) INTERPOSER TO COUPLE A MICROELECTRONIC DEVICE PACKAGE TO A CIRCUIT BOARD

(75) Inventors: Thomas E. Pearson, Beaverton, OR (US); George L. Arrigotti, Portland, OR (US); Raiyomand F. Aspandiar, Portland, OR (US); Christopher D. Combs, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 39 days.

(21) Appl. No.: 10/080,438

(22) Filed: Feb. 21, 2002

(65) Prior Publication Data

US 2003/0156396 A1 Aug. 21, 2003

(51) Int. Cl.[7] .............................. H05K 1/11; H05K 3/42
(52) U.S. Cl. ..................... 174/255; 174/262; 174/263; 174/264; 174/266; 257/698; 361/768; 361/771; 29/830; 29/852
(58) Field of Search .............................. 361/767, 768, 361/769, 771, 803; 174/262–264, 266, 255; 257/698, 723, 737, 738, 772, 778, 779, 785; 29/830, 840, 852

(56) References Cited

U.S. PATENT DOCUMENTS

| | | | | |
|---|---|---|---|---|
| 5,140,745 A | * | 8/1992 | McKenzie, Jr. ............... | 29/852 |
| 5,760,469 A | * | 6/1998 | Higashiguchi et al. ...... | 257/678 |
| 6,080,936 A | * | 6/2000 | Yamasaki et al. ........... | 174/263 |
| 6,098,283 A | * | 8/2000 | Goetsch et al. ............... | 29/852 |
| 6,198,634 B1 | * | 3/2001 | Armezzani et al. ......... | 361/760 |
| 6,335,491 B1 | * | 1/2002 | Alagaratnam et al. ...... | 174/260 |
| 6,534,726 B1 | * | 3/2003 | Okada et al. ............... | 174/263 |
| 2002/0093803 A1 | * | 7/2002 | Olzak et al. ................ | 361/767 |

* cited by examiner

Primary Examiner—John B. Vigushin
(74) Attorney, Agent, or Firm—Blakely, Sokoloff, Taylor & Zafman LLP

(57) ABSTRACT

An interposer to couple a microelectronic device package to a motherboard is formed from a PCB substrate. Multiple via holes are drilled through a copper-clad PCB substrate and then coated inside with copper. The copper surface coating is etched to form multiple traces. In one embodiment, the substrate is cut through each row of via holes and between each row of via holes to produce multiple individual beam-and-trace interposers. Two or more such interposers may be affixed together to form a beam-and-trace interposer array. Alternatively, the substrate is not cut into strips, and each via hole is filled completely with a conductive material to form an array of solid conductive columns through the substrate.

21 Claims, 11 Drawing Sheets

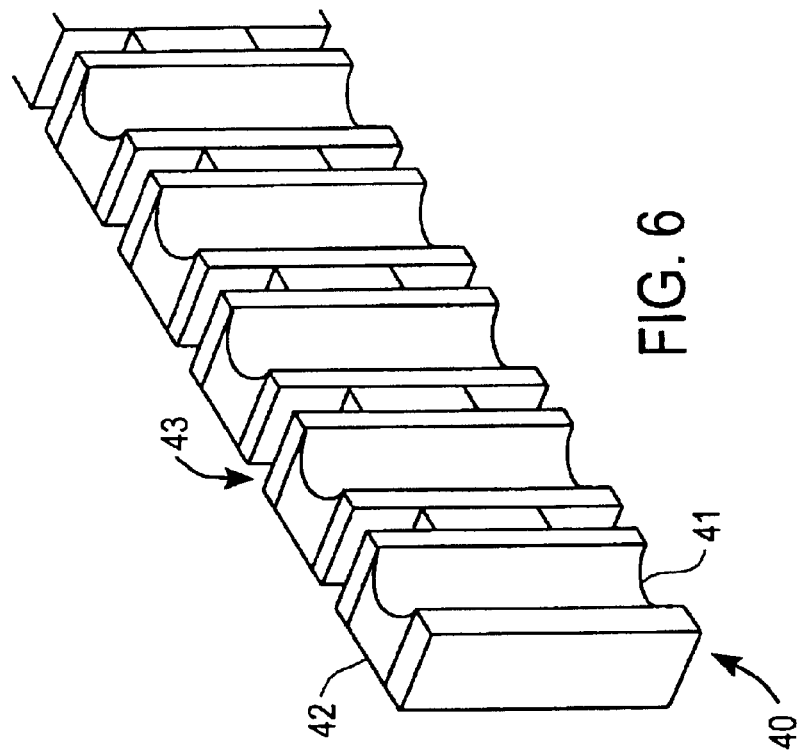
FIG. 6
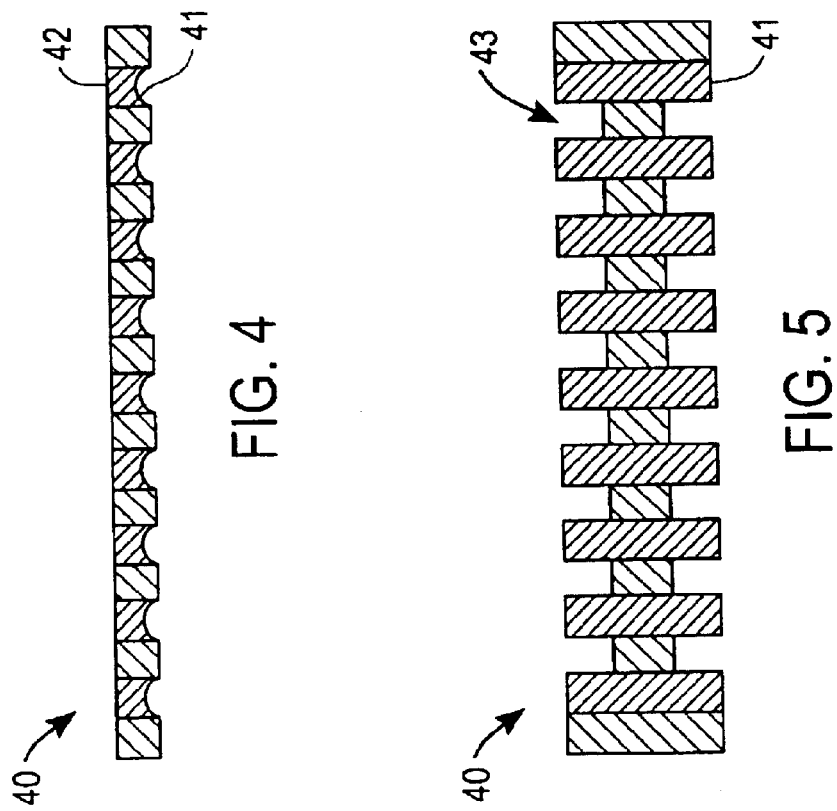
FIG. 4
FIG. 5

INTERPOSER TO COUPLE A MICROELECTRONIC DEVICE PACKAGE TO A CIRCUIT BOARD

FIELD OF THE INVENTION

The present invention pertains to the fabrication and assembly of microelectronic devices and related components. More particularly, the present invention relates to an interposer to couple a microelectronic device package to a circuit board.

BACKGROUND OF THE INVENTION

In microelectronic device manufacturing, a microelectronic circuit chip, or "die", is commonly mounted to a "package" before it is integrated into a larger system. The package serves to protect the die and may provide a standardized interface between the die and the system in which it will be used. The package with the integrated die is subsequently mounted to a printed circuit board (PCB), such as a motherboard in a computer system.

One common technology for connecting these components together is the ball grid array (BGA), an array of round solder balls that form the input/output (I/O) terminals between the components. FIG. 1 shows an example of the current state of the art for attaching BGA components to PCBs. A semiconductor die 1 is mounted to a package 2 by solder balls 4 in a first BGA. The package 2 is coupled to a PCB substrate 3 (e.g., a motherboard) by solder balls 5 in a second BGA, which may be of a different size and/or composition than solder balls 4 which couple the die 1 to the package 2.

With each device generation, the number of inputs and outputs required in microelectronic devices tends to increase. This trend increases the I/O density requirements for ball grid arrays (BGAs). Thus far, the increase in I/O density requirements has been handled mainly by reducing the solder ball pitch in the BGA. Solder ball pitch is the shortest distance of one ball to the next ball. A reduction in pitch of a BGA requires scaling down the size the solder balls to be proportionally smaller in diameter. However, smaller diameter solder balls produce a smaller standoff height between the package and the PCB and reduce solder joint strength. This reduction in solder ball strength can cause solder joint fatigue during thermal cycling and result in electrically open solder joints.

Under-fill epoxy can be used to improve mechanical solder joint strength and is sometimes used to improve mechanical bonding of the package to the PCB. The under-fill process is expensive, however, and is not conducive to current high volume surface mount technology (SMT) for motherboard manufacturers. The epoxy under-fill process also is problematic with larger BGAs, where under-fill cannot reliability fill under the package completely. Furthermore, the epoxy under-fill process makes it difficult if not impossible to rework faulty components.

There is a need, therefore, to increase I/O density for microelectronic devices, without increasing BGA package size or reducing solder joint reliability. in microelectronic devices tends to increase. This trend increases the I/O density requirements for ball grid arrays (BGAs). Thus far, the increase in I/O density requirements has been handled mainly by reducing the solder ball pitch in the BGA. Solder ball pitch is the shortest distance of one ball to the next ball. A reduction in pitch of a BGA requires scaling down the size the solder balls to be proportionally smaller in diameter. However, smaller diameter solder balls produce a smaller standoff height between the package and the PCB and reduce solder joint strength. This reduction in solder ball strength can cause solder joint fatigue during thermal cycling and result in electrically open solder joints.

Under-fill epoxy can be used to improve mechanical solder joint strength and is sometimes used to improve mechanical bonding of the package to the PCB. The under-fill process is expensive, however, and is not conducive to current high volume surface mount technology (SMT) for motherboard manufacturers. The epoxy under-fill process also is problematic with larger BGAs, where under-fill cannot reliability fill under the package completely. Furthermore, the epoxy under-fill process makes it difficult if not impossible to rework faulty components.

There is a need, therefore, to increase I/O density for microelectronic devices, without increasing BGA package size or reducing solder joint reliability.

BRIEF DESCRIPTION OF THE DRAWINGS

The present invention is illustrated by way of example and not limitation in the figures of the accompanying drawings, in which like references indicate similar elements and in which:

FIG. 4 illustrates a top or bottom view of a beam-and-trace interposer;

FIG. 5 illustrates a side view of a beam-and-trace interposer;

FIG. 6 illustrates a perspective view of a beam-and-trace interposer;

DETAILED DESCRIPTION

Figure 1:
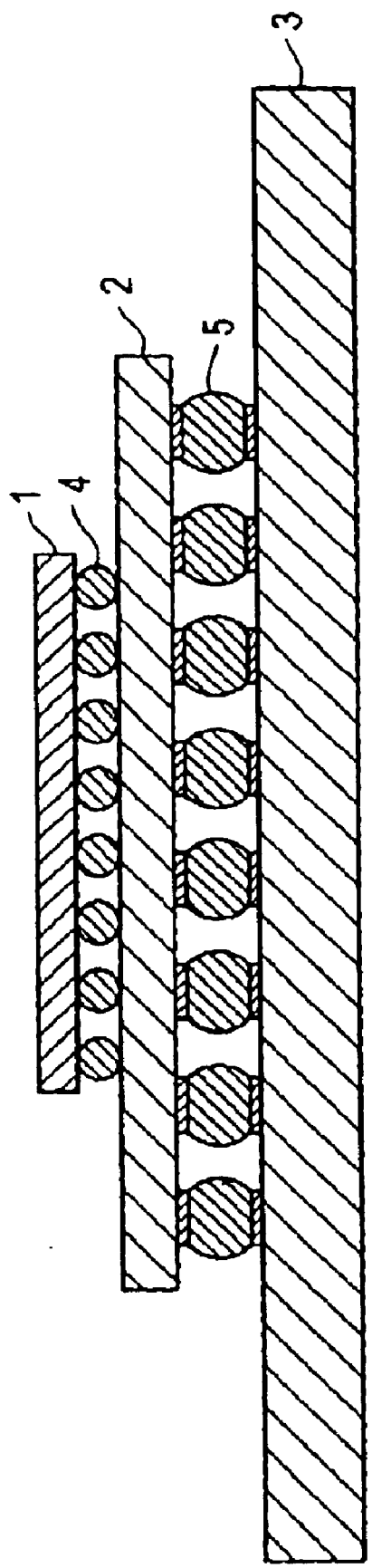
FIG. 1 shows an assembly including a die mounted to a package, which is mounted to a PCB using conventional solder balls.

An interposer to couple a microelectronic device package to a circuit board is described. Note that in this description, references to "one embodiment" or "an embodiment" mean that the feature being referred to is included in at least one embodiment of the present invention. Further, separate references to "one embodiment" in this description do not necessarily refer to the same embodiment; however, neither are such embodiments mutually exclusive, unless so stated and except as will be readily apparent to those skilled in the art. For example, a feature, structure, act, etc. described in one embodiment may also be included in other embodiments. Thus, the present invention can include a variety of combinations and/or integrations of the embodiments described herein.

As described in greater detail below, the interposer is made from a PCB substrate and is constructed as follows. A PCB substrate (hereinafter "PCB substrate" or simply "substrate") is coated on its top and bottom surfaces with a conductive material, such as copper. Multiple via holes are then drilled through the substrate, to form a two-dimensional array of via holes, and then coated inside with the conductive material to provide an electrically conductive channel from the top surface to the bottom surface through each via hole. The conductive material on the top and bottom surfaces is then selectively etched to form multiple traces, each in electrical contact with the conductive coating in one of the via holes. Grooves are then carved in the substrate between the via holes and traces.

In one embodiment, the substrate is then cut into strips through the middle of each row of via holes, to produce a number of individual beam-and-trace interposers that can be coupled between a device package and another PCB (e.g., motherboard). Each individual interposer includes a row of electrically conductive channels, each formed from the half-barrel of a via hole. Two or more of these interposers can be affixed together to form an array that can be coupled as one unit between the package and the motherboard.

In another embodiment, an interposer is constructed in a manner similar to the above, except that the substrate is not cut into strips, and each via hole is filled completely with a conductive material. The conductive material in the via holes forms an array of solid conductive columns through the substrate as the electrical contacts between the package and motherboard.

The interposer described herein solves the problem of reduced solder joint shear strength that results from reduction of solder ball pitch and the associated package standoff reduction. The interposer provides a stronger solder joint in terms of shear strength by providing a greater standoff distance between the package and PCB than conventional solder balls provide. The I/O density can be significantly increased, because copper traces are used as the electrical conduit instead of solder balls, and can be made to be much thinner than current solder balls since the beam interposer supports them. Thus, the interposer described herein can significantly increase the I/O density of a BGA for a device package, without the disadvantages associated with the current state-of-the-art.

Figure 11:
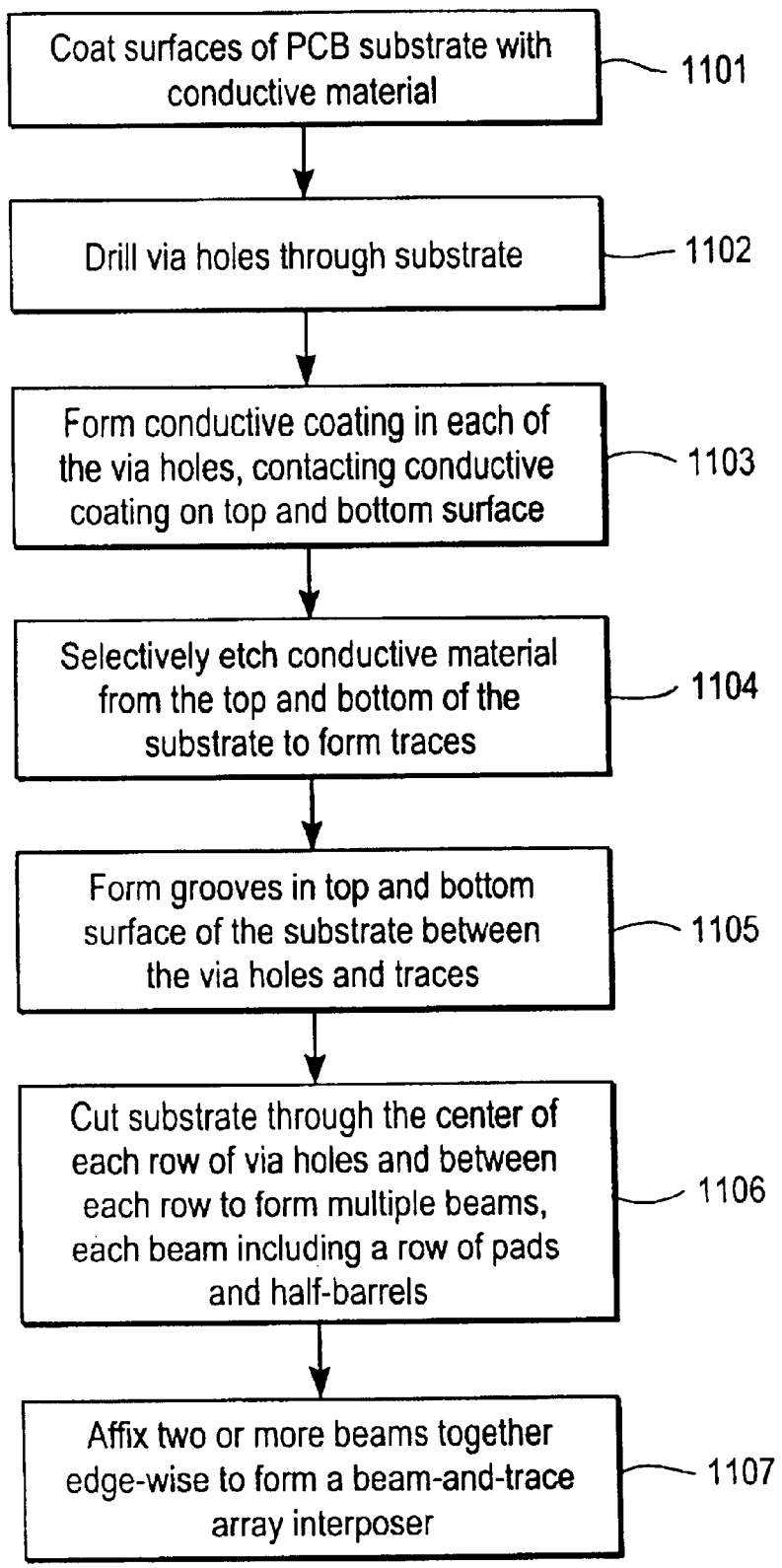
FIG. 11 is a flow diagram illustrating a process for making a beam-and-trace interposer.

A process for making a beam-and-trace interposer will now be described in greater detail, with reference to FIGS. 2 through 8 and FIG. 11. Referring first to FIG. 11, at 1101 the top and bottom surfaces of a PCB substrate are coated with a conductive material, such as copper cladding (as henceforth assumed herein). This may be accomplished using any well-known copper coating process such as commonly used in PCB fabrication. The substrate can be composed of the same material from which PCBs are commonly constructed, such as FR4. In one embodiment, the substrate is 1.5 mm (0.062") thick, providing a greater standoff distance between the package and the motherboard in comparison to the 0.024" diameter solder balls commonly used to couple a package to motherboard.

Figure 3A:
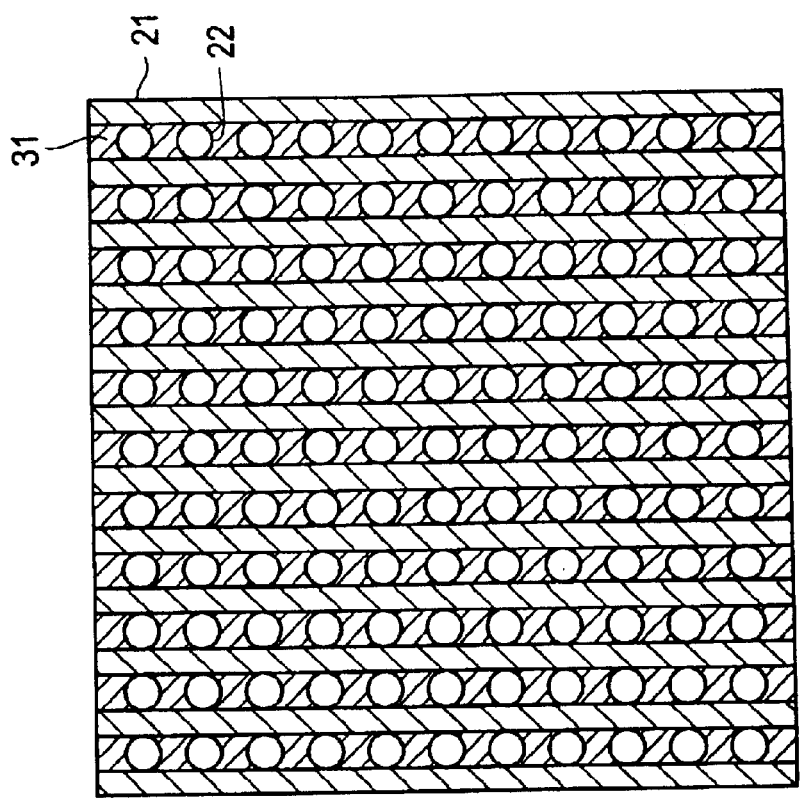
FIG. 3A illustrates the PCB substrate of FIG. 2 with the addition of copper traces.
Figure 2:
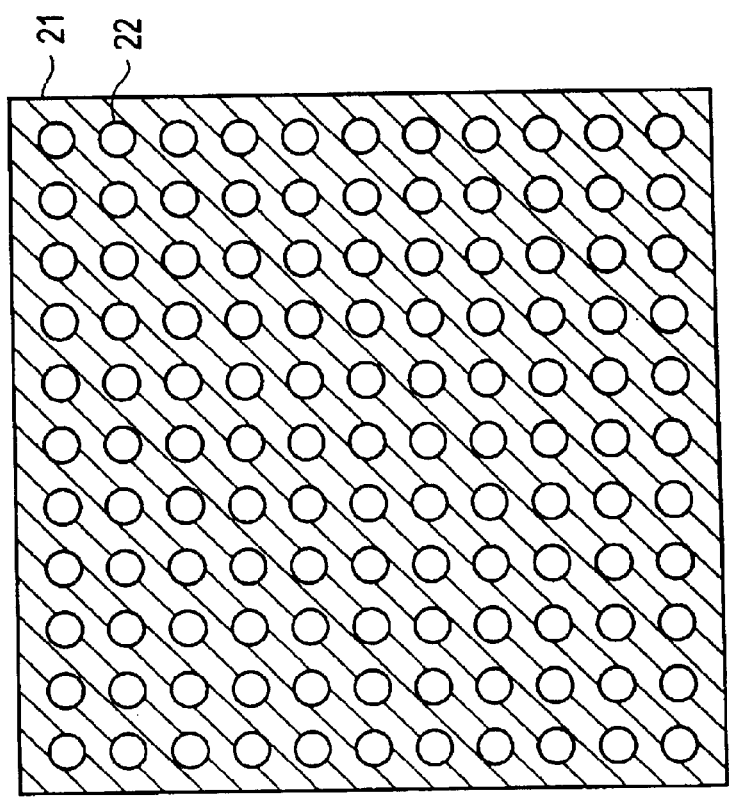
FIG. 2 illustrates a PCB substrate with an array of via holes drilled in it.
Figure 3C:
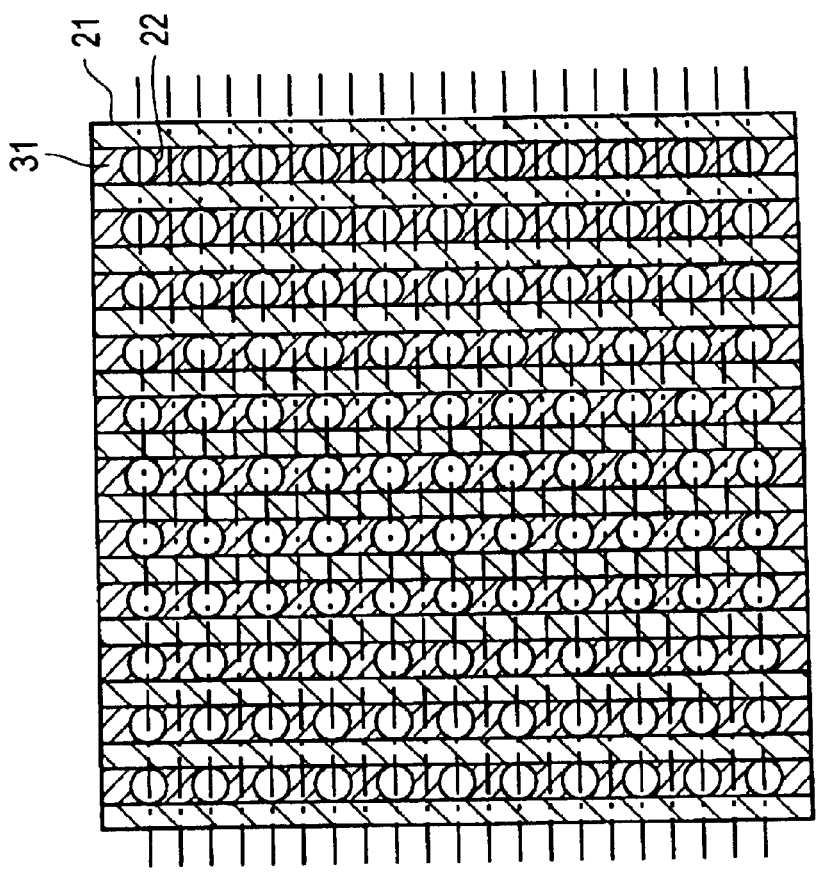
FIG. 3C illustrates the locations where the PCB substrate is cut in making a beam-and-trace interposer.
Figure 3B:
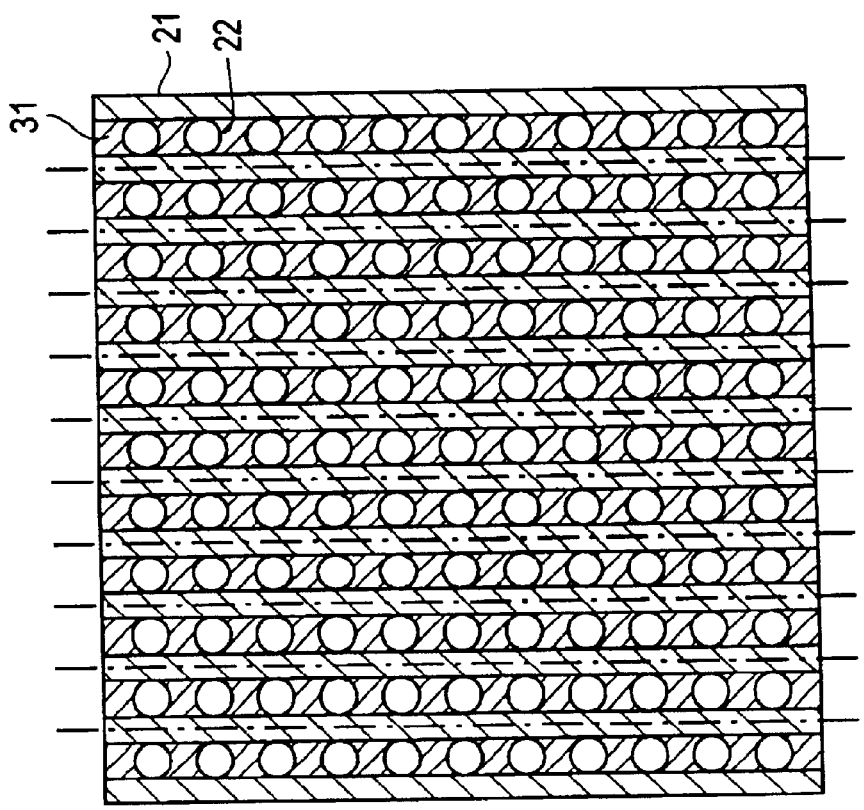
FIG. 3B illustrates the locations of grooves carved in the PCB substrate in making a beam-and-trace interposer.
Figure 3D:
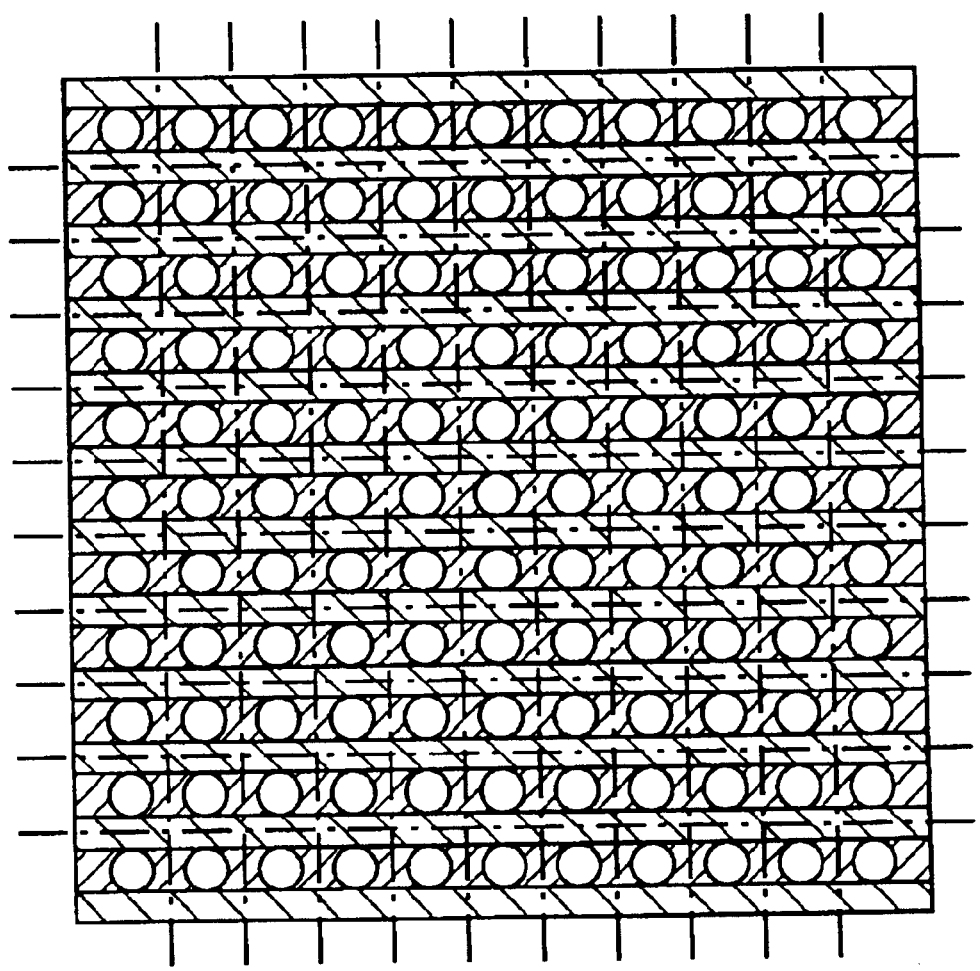
FIG. 3D illustrates the locations of grooves carved in the PCB substrate in making a conductive column interposer

At 1102, multiple through holes ("via holes") are drilled in the substrate, to form an array of via holes. In one embodiment, the via holes are 0.245 mm (0.010") in diameter and are drilled at 0.020" centers. The result is illustrated in FIG. 2, which shows a PCB substrate 21 with an array of via holes 22 drilled in it. Next, at 1103 a conductive coating, which may also be copper, is formed on the walls of all of the via holes, such that the coating completely coats the inside of the via holes and contacts the conductive coating on the top and bottom surfaces of the substrate. This procedure creates an electrical connection from the top side to the bottom side of the substrate. At 1105 the copper on the top and bottom surfaces is selectively etched in a photo etching process to form multiple copper traces (also called "pads"). The result is illustrated in FIG. 3A, which shows essentially linear copper traces 31, each through a different row of via holes. Note, however, that different trace patterns may be used in alternative embodiments. At 1105, a routing or diamond saw process is used to carve linear grooves in the top and bottom surfaces of the substrate, between the via holes and traces. In general, it is sufficient to carve these grooves all in one direction. The dashed lines in FIG. 3B show where the grooves would be made for the embodiment of FIG. 3A. The grooves make the substrate more compliant in the event of temperature coefficient expansion (TCE) rate mismatch between the package and the interposer. Next, at 1106 the substrate is cut into individual substrate members through the middle of each row of via holes and halfway between each row of via holes, using a diamond saw or other suitable tool, to produce a number of individual beam-and-trace interposers. The dashed lines in FIG. 3C show were the cuts would be made.

An example of such an interposer is illustrated in FIGS. 4, 5 and 6. FIGS. 4 and 5 show two orthogonal views of the interposer 40; specifically, FIG. 4 shows the top or bottom view (these views are identical) while FIG. 5 shows the corresponding side view. FIG. 6 shows a perspective view of a portion of the interposer 40. Each beam-and-trace interposer 40 has multiple, copper-coated half-barrels 41 in its side (formed from the bisected via holes in a given row), multiple, roughly semi-circular copper pads 42 on its top and bottom surfaces, and multiple grooves 43 carved in the top and bottom surfaces of the substrate. The pads 42 and via half-barrels 41 will form electrically conductive channels between the device package and the motherboard.

The semi-circular copper pads give the interposer more surface area to attach to the package substrate or the motherboard, resulting in a stronger solder joint. The copper pads and barrels can be plated with gold, silver or solder to protect the copper coating from oxidizing and to provide a wettable surface area for the solder joint. The grooves in the beam give the beam a horizontal axis that complies with the thermal co-efficient of expansion (TCE) mismatch between the component substrate and motherboard warp.

Figure 7:
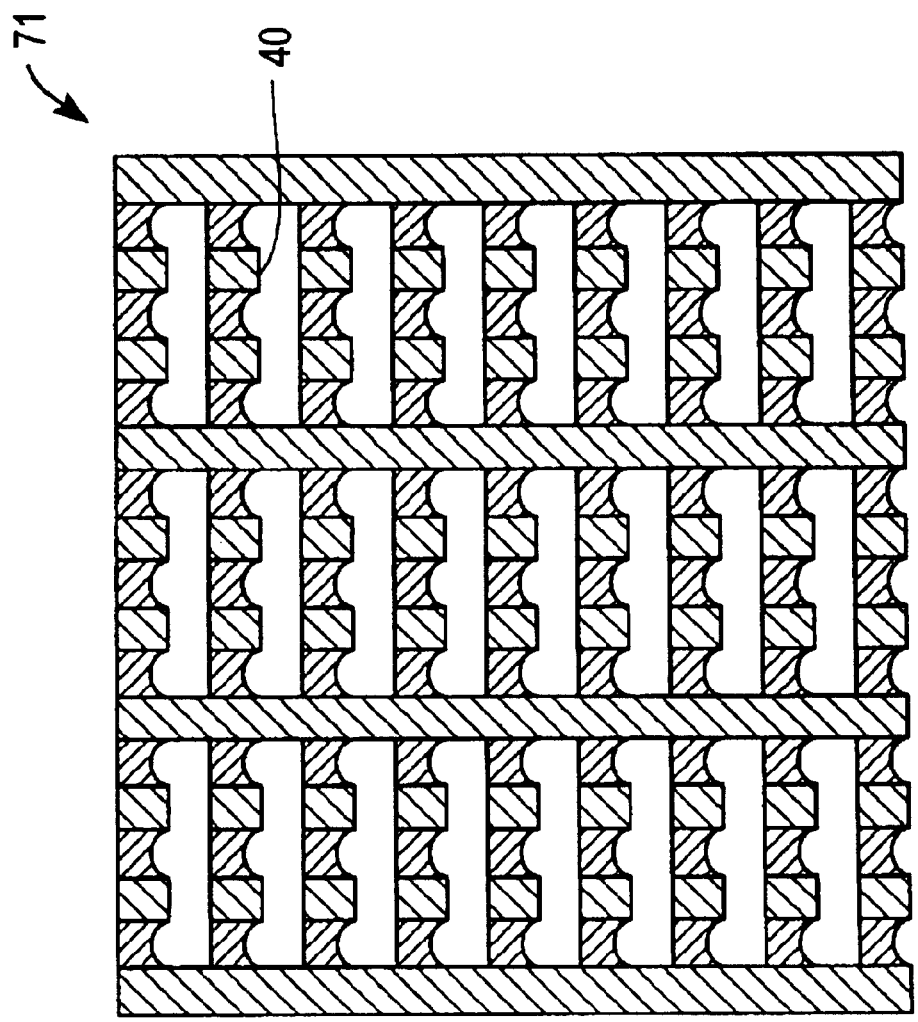
FIG. 7 illustrates a beam-and-trace interposer array comprising multiple beam-and-trace interposers coupled together.

Finally, at 1107 two or more of these beam-and-trace interposers are affixed together, using glue (e.g., epoxy) or any other suitable fastening substance or structure, to form an interposer comprising an array of these individual beam-and-trace interposers, to be coupled as a unit between the device package and the motherboard. FIG. 7 shows an example of an interposer comprising multiple individual beam-and-trace interposers 40 attached together in this manner to form a single interposer 71. In other embodiments, multiple beam-and-trace interposers can be individually coupled between the package and the motherboard. In still other embodiments, it is possible that only a single beam-and-trace interposer (i.e., only one beam) may be required.

Figure 8:
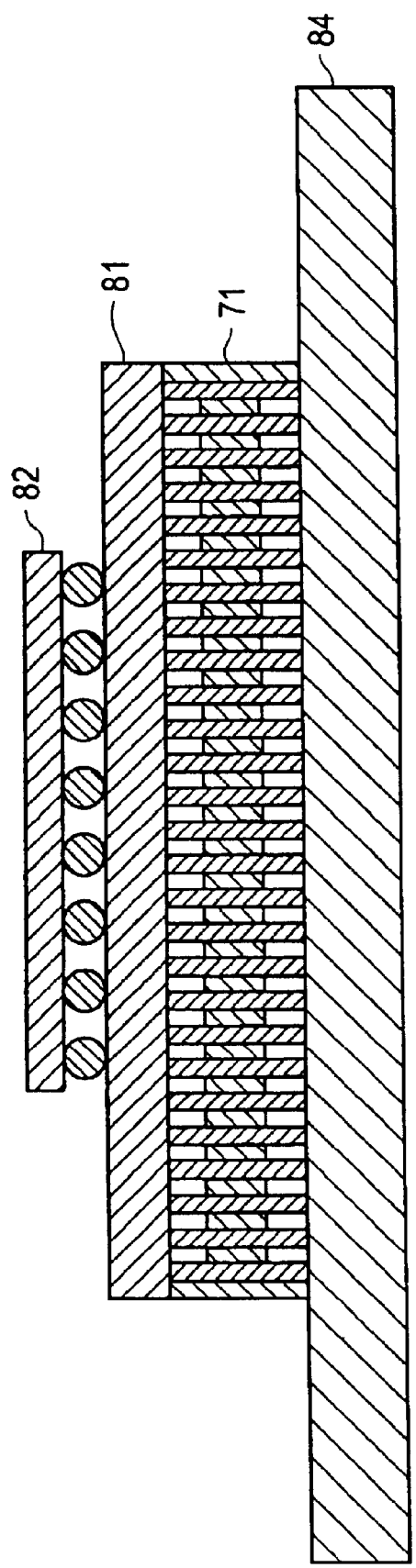
FIG. 8 illustrates an assembly including a die mounted to a package, which is mounted to a PCB by a beam-and-trace interposer.
Figure 13:
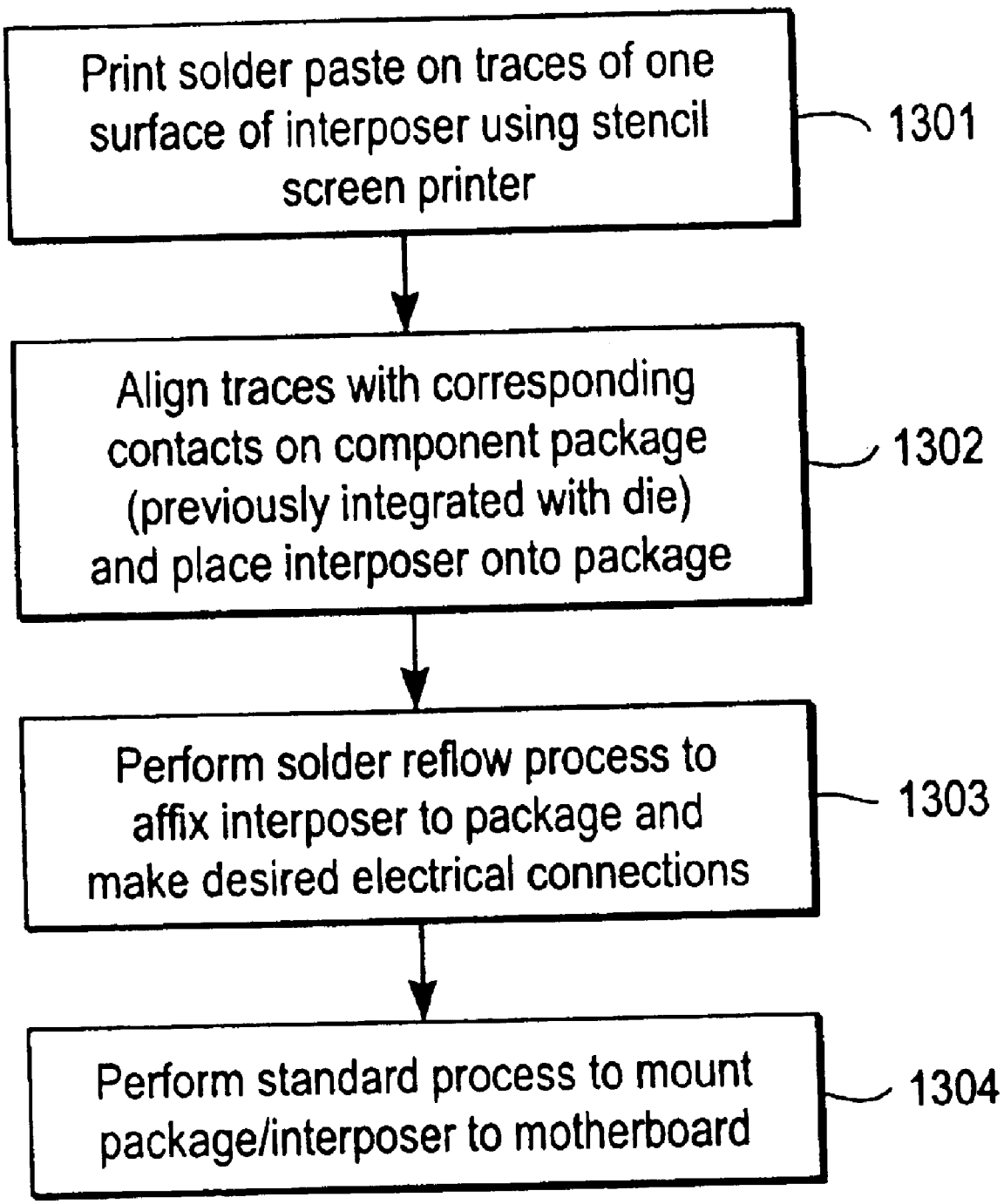
FIG. 13 is a flow diagram illustrating a process for mounting an interposer to a device package and a motherboard.

FIG. 8 illustrates how the beam-and-trace interposer 71 can be used to couple a microelectronic device package to a PCB. A die 82 is mounted to the device package 81, which is coupled to one side of a beam-and-trace interposer 71. The opposite side of the interposer 71 is coupled to a PCB 84 to make the electrical and mechanical connection necessary for the device to function. FIG. 13 illustrates a normal SMT solder paste and reflow process that can be used to attach a beam-and-trace interposer to a device package and a PCB. At 1301 a solder paste of 0.178 mm (0.007") thickness is printed on the traces of the top surface of the interposer using a stencil screen printer. At 1302 the copper pads on interposer are lined up with corresponding contacts of the package (to which the die has previously been mounted), and the interposer is then placed onto the package. The two assemblies are then reflowed in a solder reflow oven to make electrical and mechanical connections between the pads of the interposer and the contacts of the package. At 1304 a standard process is used to mount the bottom side of the interposer to the PCB.

Assuming the interposer is formed from a standard-thickness PCB substrate, the resulting standoff distance between the package and the motherboard is approximately six times taller than when standard solder balls are used to couple the package to the motherboard. The interposer greatly improves the shear strength of the solder joints. The taller solder joint allows less movement of the solder joint between the beam and trace interposer and the component substrate/mother board during thermal cycling.

The beam-and-trace interposer provides the vertical support for the traces that connect the package to the motherboard. This technique allows the traces to be very thin but does not adversely affect the vertical strength of the interposer. This technique thereby allows the interposer to handle heavy heat sinks with preloads without the interposer collapsing.

Figure 9:
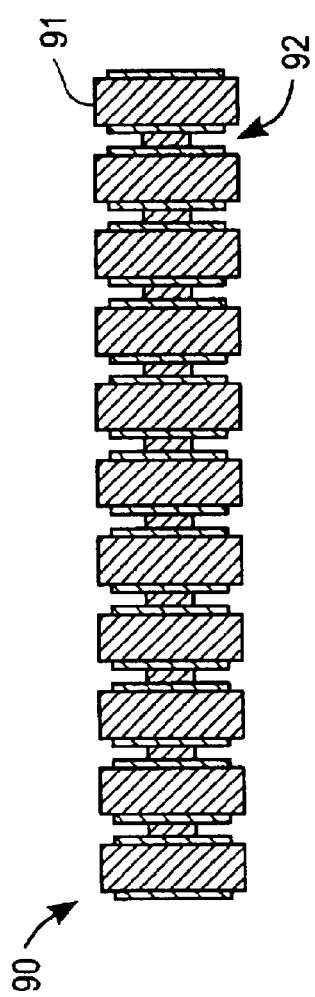
FIG. 9 is a cross-sectional side view of a conductive column interposer.
Figure 10:
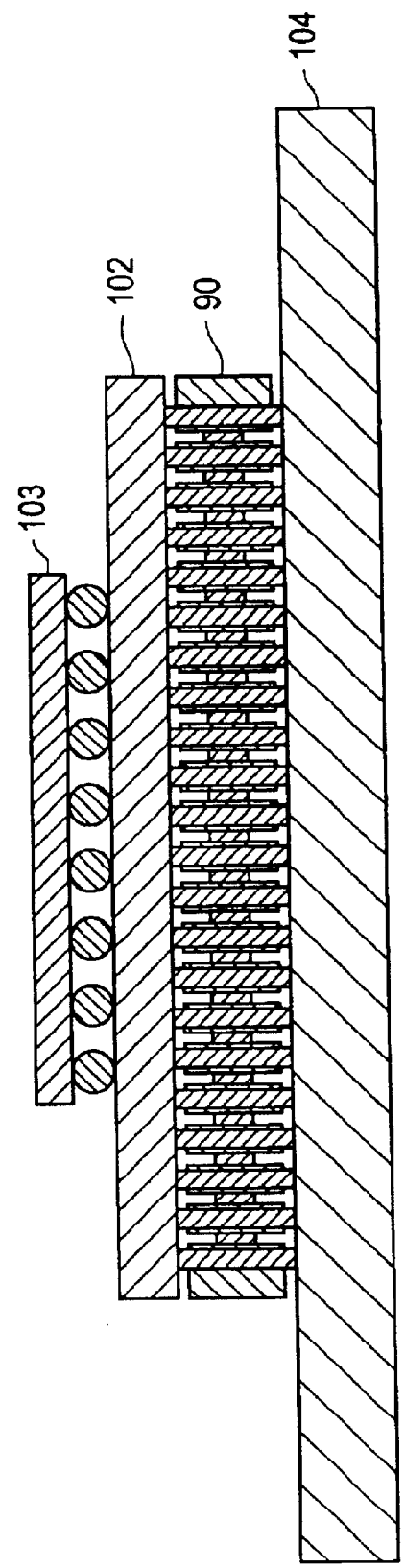
FIG. 10 shows an assembly that includes a die mounted to a package, which is mounted to a PCB by a conductive column interposer.
Figure 12:
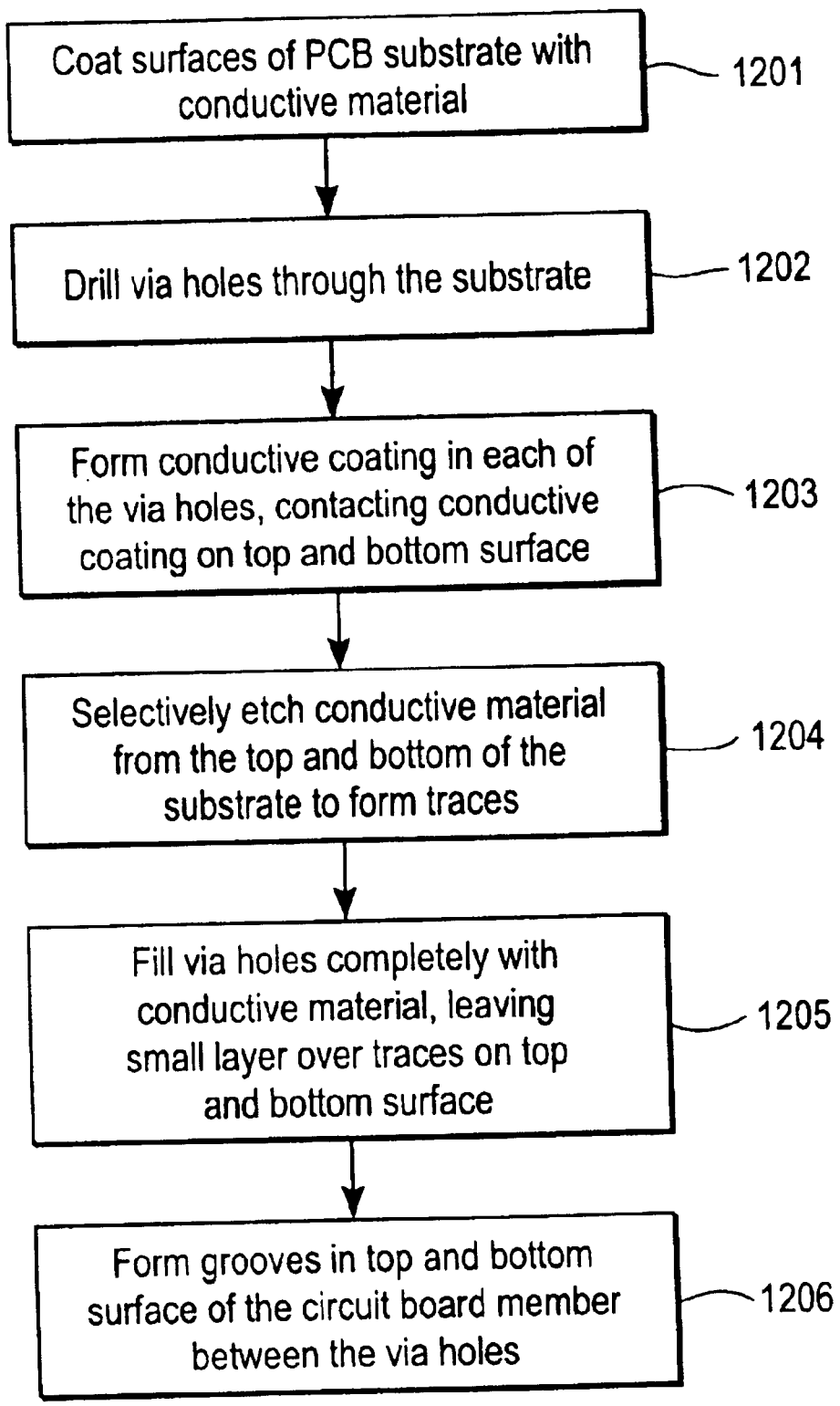
FIG. 12 is a flow diagram illustrating a process for making a conductive column interposer.

FIGS. 9, 10 and 12 relate to another embodiment of a PCB-based interposer, referred to as a conductive column interposer. This embodiment can be constructed in a manner similar to the beam-and-trace interposer, except that the substrate is not cut into multiple beams, and each via hole is filled completely with a conductive material. The conductive material forms an array of solid conductive columns through the substrate to provide the electrical contacts between the package and motherboard.

FIG. 9 shows a side cross-sectional view of a conductive column interposer according to one embodiment. As can be seen, the interposer 90 includes solid conductive columns 91 within the via holes as well as grooves 92 in the substrate between the via holes. As shown by the dashed lines in FIG. 3D, however, the grooves 92 are made along two perpendicular axes in the conductive column interposer, rather than along just one axis as in the beam-and-trace interposer. FIG. 10 shows an assembly that includes the conductive column interposer 90 coupled to a device package 102 (on which a die 103 is mounted) and a PCB 104.

FIG. 12 shows a process for making a conductive column interposer. In the illustrated process, blocks 1201 through 1204 are essentially identical to blocks 1101 through 1104 described above, respectively, and therefore will not be discussed again in detail. Following block 1204, at block 1205 the via holes are filled with a high-lead-content conductive material, leaving a small layer of the material over the copper traces on the top and bottom surface of the substrate. The result is in an array of solid conductive columns through the via holes. The fill material may be, for example, high-temperature solder deposited by a hot air solder leveling (HASL) process or over-plating process. A high-lead-content material is used so that the conductive columns have a high melting temperature, to prevent them from reflowing when the interposer is subsequently mounted to the motherboard. The composition of the conductive columns may be, for example, 85 percent lead (Pb) and 15 percent tin (Sn). Note, however, that other conductive materials, such as silver or copper, can be used to fill the via holes if the use of lead is considered undesirable (e.g., for environmental reasons).

At 1206, linear grooves are carved in the top and bottom surfaces of the substrate between the via holes and traces in essentially the same manner as described for block 1105, above, except that grooves are carved both horizontally and vertically.

The conductive column interposer may be coupled to a device package and motherboard using essentially the same process as used for the beam-and-trace interposer, as described in conjunction with FIG. 13.

Thus, an interposer to couple a microelectronic device package to a circuit board has been described. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative sense rather than a restrictive sense.

What is claimed is:

1. An interposer to couple an electronic component package to a circuit board, the interposer comprising a plurality of beams coupled to each other, each of the beams comprising a circuit board substrate having a first surface and a second surface;

a first plurality of conductive contacts disposed on the first surface to be coupled to the electronic component package;

a second plurality of conductive contacts disposed on the second surface to be coupled to the circuit board; and a plurality of conductive paths, each separately connecting one of the first plurality of conductive contacts with one of the second plurality of conductive contacts, wherein each of the conductive paths comprises a conductive coating formed in a recessed channel in an edge of the substrate, the edge perpendicular to the first surface and the second surface, wherein each of the recessed channels is a portion of a through hole.

2. An interposer as recited in claim 1, wherein the plurality of beams are coupled together to form an array of conductive paths to couple the electronic component package to the circuit board.

3. An interposer as recited in claim 1, further comprising a first plurality of grooves in the first surface between the first plurality of conductive contacts.

4. An interposer as recited in claim 3, further comprising a second plurality of grooves in the second surface between the second plurality of conductive contacts, parallel to the first plurality of grooves.

5. An interposer comprising:
   a circuit board substrate member having a first surface and a second surface parallel to each other, the substrate further having an edge perpendicular to the first surface and the second surface;
   a first plurality of conductive contact pads on the first surface;
   a second plurality of conductive contact pads on the second surface; and
   a plurality of recessed channels in the edge of the substrate member, extending from the first surface to the second surface, each of the recessed channels having a conductive material therein to form a conductive path between one of the first plurality of contact pads and one of the second plurality of contact pads; and
   a first plurality of grooves in the first surface between the contact pads on the first surface.

6. An interposer as recited in claim 5, wherein each of the recessed channels is a portion of a through hole.

7. An interposer as recited in claim 5, further comprising a second plurality of grooves in the second surface between the contact pads on the second surface.

8. An interposer as recited in claim 5, wherein the first plurality of conductive contact pads and the second plurality of conductive contact pads are spaced at an equal pitch.

9. A device to couple an electronic component package to a circuit board, the device comprising a plurality of interposers coupled to each other, each being an interposer as recited in claim 5.

10. A device as recited in claim 9, wherein the plurality of interposers are coupled together to form an array of conductive paths to couple the electronic component package to the circuit board.

11. An interposer comprising:
   a circuit board substrate having a first surface and a second surface parallel to each other;
   a first plurality of conductive contact pads on the first surface;
   a second plurality of conductive contact pads on the second surface;
   a plurality of solid conductive columns through the substrate perpendicular to the first surface and the second surface, each in electrical contact with one of the first plurality of contact pads and one of the second plurality of contact pads; and
   a first plurality of grooves in the first surface between the conductive columns on the first surface.

12. An interposer as recited in claim 11, further comprising a second plurality of grooves in the second surface between the conductive columns on the second surface.

13. An interposer as recited in claim 12, further comprising:
   a third plurality of grooves in the first surface between the conductive columns, perpendicular to the first plurality of grooves; and
   a fourth plurality of grooves in the second surface between the conductive columns, perpendicular to the second plurality of grooves.

14. An interposer as recited in claim 11, wherein the conductive columns are formed from an alloy of tin (Sn) and lead (Pb), comprising at least 81% lead (Pb).

15. An apparatus comprising:
   a die;
   a package coupled to the die; and
   an interposer coupled to the package and formed from a circuit board substrate, by which the apparatus can be electrically coupled to a circuit board, the interposer comprising
      a first surface on which are disposed a first plurality of contacts through which the interposer is coupled to the package,
      a second surface on which are disposed a second plurality of contacts to couple the interposer to the circuit board,
      a plurality of conductive paths between the first surface and the second surface, each of the conductive paths formed by a solid conductive column through the substrate;
      a first plurality of grooves in the first surface between the conductive columns, and
      a second plurality of grooves in the first surface between the conductive columns, perpendicular to the first plurality of grooves.

16. An apparatus as recited in claim 15, wherein the interposer is to be fixedly coupled to the circuit board.

17. An apparatus as recited in claim 15, further comprising:
   a third plurality of grooves in the second surface between the conductive columns; and
   a fourth plurality of grooves in the second surface between the conductive columns, perpendicular to the third plurality of grooves.

18. An apparatus as recited in claim 15, wherein each of the conductive columns has a composition of tin (Sn) and lead (Pb), comprising at least 81% lead (Pb).

19. A method of coupling an electronic circuit package to a circuit board, the method comprising:
   fixedly coupling a plurality of electrical contacts on a first surface of an interposer to the electronic circuit package, the interposer formed from a plurality of beams coupled to each other, each of the beams comprising a circuit board substrate having the first surface, a second surface, and a plurality of conductive paths from the first surface to the second surface; and
   fixedly coupling a plurality of electrical contacts on the second surface of each of the beams to the circuit board.

20. A method as recited in claim 19, wherein the electronic circuit package includes a semiconductor die.

21. A method as recited in claim 20, wherein the circuit board is a motherboard.

* * * * *